(12) United States Patent
Alekseev

(10) Patent No.: US 11,153,991 B2
(45) Date of Patent: Oct. 19, 2021

(54) METHOD AND APPARATUS FOR COOLING A LOAD AND SYSTEM COMPRISING CORRESPONDING APPARATUS AND LOAD

(71) Applicant: LINDE AKTIENGESELLSCHAFT, Munich (DE)

(72) Inventor: Alexander Alekseev, Wolfratshausen (DE)

(73) Assignee: LINDE AKTIENGESELLSCHAFT, Munich (DE)

( * ) Notice: Subject to any disclaimer, the term of this patent is extended or adjusted under 35 U.S.C. 154(b) by 188 days.

(21) Appl. No.: 16/484,716

(22) PCT Filed: Jan. 10, 2018

(86) PCT No.: PCT/EP2018/025005
§ 371 (c)(1),
(2) Date: Aug. 8, 2019

(87) PCT Pub. No.: WO2018/145816
PCT Pub. Date: Aug. 16, 2018

(65) Prior Publication Data
US 2020/0045849 A1 Feb. 6, 2020

(30) Foreign Application Priority Data
Feb. 8, 2017 (EP) .................................. 17020047

(51) Int. Cl.
*H05K 7/20* (2006.01)
(52) U.S. Cl.
CPC ..... *H05K 7/20372* (2013.01); *H05K 7/20327* (2013.01); *H05K 7/20936* (2013.01)
(58) Field of Classification Search
CPC .......... H05K 7/20327; H05K 7/20372; H05K 7/20936; F25B 9/002; F25B 9/14;
(Continued)

(56) References Cited

U.S. PATENT DOCUMENTS 2,487,863 A * 11/1949 Garretson ................. F17C 7/02
62/50.1
3,303,660 A * 2/1967 Berg ....................... F17C 13/02
62/48.2
(Continued)

FOREIGN PATENT DOCUMENTS

DE 102012016292 A1 2/2014
DE 102014224363 A1 6/2016
EP 1030135 A1 8/2000

OTHER PUBLICATIONS

International Search Report for PCT/EP2018/025005 dated Jun. 6, 2018.
(Continued)

*Primary Examiner* — Frantz F Jules
*Assistant Examiner* — Martha Tadesse
(74) *Attorney, Agent, or Firm* — Millen, White, Zelano & Branig; Brion P. Heaney

(57) ABSTRACT

A method and apparatus for cooling a load using liquid nitrogen conveyed in a circuit are provided. Cooled liquid nitrogen is used for cooling the liquid nitrogen conveyed in the circuit. A first proportion of the liquid nitrogen is cooled in an open cooling system and a second proportion is cooled in a closed cooling system using one or more cooling units. The open cooling system and closed cooling system are used for cooling of a power supply having a first end and a second end. The open cooling system is arranged at the first end and the closed cooling system is arranged at the second end. Cooling power is provided in a first time period as a first, smaller amount of total cooling power and in a second time period as a second, higher amount of total cooling power. A first proportion of the amount of total cooling power is provided by means of the open cooling system and a second proportion is provided by means of the closed cooling
(Continued)

system. The first proportion in the first time period is set to a lower value than in the second time period.

10 Claims, 3 Drawing Sheets

(58) Field of Classification Search
CPC ....... F25B 19/005; H01B 12/16; Y02E 40/60; F25D 3/10; H01F 6/04
See application file for complete search history.

(56) References Cited

U.S. PATENT DOCUMENTS

| | | | | |
|---|---|---|---|---|
| 3,874,185 A * | 4/1975 | Etzbach | ................ | F25J 1/0277 62/48.2 |
| 3,933,003 A * | 1/1976 | Markum | .................. | F25B 9/02 62/85 |
| 4,249,387 A * | 2/1981 | Crowley | ............... | F25J 1/0025 62/48.2 |
| 4,548,053 A * | 10/1985 | Brown | ..................... | F25B 9/00 62/500 |
| 4,689,064 A * | 8/1987 | Boulanger | ............. | F25J 1/0202 62/47.1 |
| 4,727,723 A * | 3/1988 | Durr | ...................... | F25J 1/0208 62/48.2 |
| 4,884,409 A * | 12/1989 | Quack | ....................... | H01F 6/04 62/51.1 |
| 4,886,534 A * | 12/1989 | Castan | ...................... | F25D 3/12 62/603 |
| 5,520,005 A * | 5/1996 | Appolonia | ............ | F25D 29/001 62/63 |
| 5,829,269 A * | 11/1998 | Pecoud | .................. | F25J 1/0007 62/608 |
| 6,442,949 B1 * | 9/2002 | Laskaris | .................. | F04F 5/54 62/51.1 |
| 2017/0330663 A1 | 11/2017 | Bauer et al. | | |

OTHER PUBLICATIONS

English Abstract for DE102012016292, Publication Date: Feb. 20, 2014.
English Abstract of EP1030135, Publication Date: Aug. 23, 2000.

* cited by examiner

METHOD AND APPARATUS FOR COOLING A LOAD AND SYSTEM COMPRISING CORRESPONDING APPARATUS AND LOAD

The present invention relates to a method and an apparatus for cooling a load and a system comprising a corresponding apparatus.

RELATED ART

High and medium voltage cables and conductor rails may be constructed in the form of high temperature superconductors (HTS). Such cables and conductor rails may carry both direct current and alternating current and in the following text are referred to as "HTS power supplies". They need to be cooled to a temperature below 100 K, preferably below 80 K.

Although the present invention is described in the following mainly with reference to HTS power supplies as the load, it is also equally suitable for cooling other loads which required a cooling power to a comparable cooled level, particularly superconductor materials, but also for example cables, current carriers and other structures made of conventional metals such as copper and aluminium.

A very wide variety of methods and apparatuses are known from the related art for cooling corresponding loads. In summary, they function for example according to the following principle:

Typically, liquid nitrogen placed under elevated pressure in a pump and cooled to the required cooling temperature in a supercooler is transported to the load, where it is warmed up and finally returned to the pump.

Circuits are also known in which the supercooling of the recirculating nitrogen upstream of the pump is combined with supercooling downstream of the pump. For this purpose, two supercooler heat exchangers are needed, and they are placed in the supercooler.

In its simplest form, the heat exchanger in a supercooler is a tube coil, which is positioned in a liquid nitrogen bath ("bath nitrogen"). The warmer recirculating nitrogen passes through the tube coil and is cooled by the colder bath nitrogen on the outside. The bath nitrogen evaporates in the process. Other types of heat exchangers can also be used as alternatives to tube coil heat exchangers.

The losses that occur in the supercooler due to the evaporation of bath nitrogen are typically made up by replenishment with fresh liquid nitrogen from a reserve tank.

The pressure in the coolant circuit downstream of the pump is selected such that the recirculating nitrogen always remains liquid and no vapour bubbles are formed. From a thermodynamic point of view, this means that the pressure in the circuit must always been higher than in the supercooler bath, and that the recirculating nitrogen must be heated to above its boiling point.

The recirculating nitrogen reaches its lowest temperature at the outlet from the supercooler. This temperature is determined substantially by the temperature of the bath nitrogen used in the supercooler (and the transfer of heat in the supercooler).

In order to lower the temperature, the pressure under which the bath nitrogen is placed is reduced by continuous pumping out using a mechanical (typically oil-lubricated) vacuum pump. The lower limit of the temperature that can be reached is about 63 K, which corresponds to a vapour pressure of approximately 0.13 bar. At lower temperatures, the bath nitrogen would freeze.

The temperature of the bath nitrogen may also be lowered by integrating one or more cooling units (also called cryocoolers) in the supercooler. The one or more cooling units cool and liquefy/recondense the bath nitrogen which evaporates during the cooling until the required cooling temperature is reached; in this case, a vacuum pump is not needed. Typically the "Brayton" or "Stirling" cooling units are used as cryocoolers. Corresponding cooling systems are constructed as closed systems.

DE 10 2013 01 1 212 A1 discloses an apparatus of the type described, wherein a main aspect consists in how the change of volume of the recirculating nitrogen can be handled. It is suggested to use a line between the reserve tank and the nitrogen circuit, the opening of which is upstream of the pump. In order to achieve a similar objective, EP 1 355 1 14 A3 suggests building an expansion tank into the circuit. Expansion tanks are also used in commercially available systems, but these are typically integrated in the supercooler.

DE 197 55 484 A1 describes a method in which a liquid mixture consisting mainly of nitrogen and oxygen is used instead of recirculating nitrogen.

The use of a mechanical vacuum pump to generate cold in the supercooler represents (from the point of view of investment costs) a relatively inexpensive solution, but one which is inefficient in terms of energy. This is particularly due to the fact that the valuable (since it exists at very low temperatures) cold of the cooled nitrogen vapor sucked out is not used, but instead eliminated. As a rule, the use of cooling units is advantageous in terms of energy, but the appropriate devices are relatively expensive, so their use is often not economical.

The present invention is therefore intended to address of problem of providing improved methods and apparatuses for cooling corresponding loads.

DISCLOSURE OF THE INVENTION

In this context, the present invention suggests a method and an apparatus for cooling a load, particularly a power supply, preferably a HTS power supply, and a system having corresponding apparatus and a load.

The present invention is based on the realisation that it is particularly advantageous for cooling a corresponding load to use a combination of one open and one closed cooling system. In such an arrangement, the open cooling system is based as explained earlier on an evaporation of liquid nitrogen, the closed cooling system works using an integrated cooling unit.

Particular advantages are gained when the closed and the open cooling system are arranged at different positions of the load, when cooling a power supply particularly at different ends thereof. This is therefore provided according to the invention.

In this situation, the closed cooling system, which as explained entails greater investment cost, is designed in such manner that its cooling power is equal to 25 to 75% available cooling power of the total cooling systems, that is to say the combination of the open and closed cooling systems.

The open cooling system is designed in such manner that it can be operated in a minimum load mode, in which at least the recirculating nitrogen is circulated. In the minimum load mode, the active cooling is reduced to a system-specific minimum by pumping out the bath nitrogen.

Both cooling systems (the open and the closed cooling system) are in continuous operation. In this context, the cooling requirement of the load is preferably supplied by the cooling power of the closed system. The open cooling system is operated in the aforementioned minimum load mode. Its cooling power only supplies the cooling power that the closed cooling system is unable to provide.

A number of advantages can be gained with the measures suggested according to the invention. Within the scope of the present invention, a part of the cooling requirement may be supplied primarily by the efficient closed cooling system. This has the effect of increasing energy efficiency when cooling. Only power peaks are covered when needed by the less efficient open system. The total system suggested according to the invention consisting of one open and one closed cooling system is substantially more cost efficient than a completely closed cooling system, since much smaller quantities of nitrogen have to be circulated. The length that can be cooled may be increased considerably by the use of the different cooling systems at different positions of the load. In the case of a HTSL power supply for example, the length for delivery of the cooling power may be increased significantly.

HTS power supplies are typically operated in different load modes. These include underload, design load and overload, which result in different cooling requirements. A substantial advantage of the present invention also consists in that peaks in the cooling power requirement that arise during overload of the HTSL power supply may be handled by a power increase of the open cooling system.

In all, the present invention suggests a method for cooling a load by using liquid nitrogen which is transported in a circuit, cooled by indirect exchange of heat with cooled liquid nitrogen, and undergoes an exchange of heat with the load. As was mentioned previously, it is known to cool corresponding "recirculating nitrogen" by indirect heat exchange with more cooled nitrogen.

It is now provided within the scope of the present invention that of the cooled liquid nitrogen used to cool the liquid nitrogen that is transported in the circuit, a first part is cooled in an open cooling system by pressure reduction and removal of nitrogen vapour which forms as a result of the pressure reduction, and a second part is cooled in a closed cooling system using one or more cooling units.

Generally within the scope of the present invention, an "open" cooling system is understood to be a cooling system in which a coolant evaporates and the cooling vapours formed by the evaporation are removed from the cooling system. An open cooling system is thus characterized by continuous consumption of coolant, which is replenished from a storage reservoir, for example.

In contrast, a "closed" cooling system in this context is understood to be one in which a coolant is transported in the circuit and is cooled during the process. In a closed cooling system there is generally no unavoidable consumption of the coolant.

Within the scope of the present invention, the one or more cooling units which are used in the closed cooling system in particular comprise one or more Stirling cooling units and/or one or more Brayton cooling units which are powered by neon and/or helium. Cooling units of such kind are known from the related art.

A Stirling cooling unit is a cooling unit which is based on the operating principle of the Stirling engine. Brayton cooling units work with a noble gas or noble gas mixture such as helium and/or neon as the working gas. This is fed to a compressor "warm" and compressed therein. Compression heat is dissipated using a suitable coolant such as water, air or liquid nitrogen.

The working gas is relaxed, used for cooling and then returned to the compressor again. Before the working gas is relaxed, it is cooled in a counterflow with the working gas that was used for cooling previously.

As was explained earlier, in order to cool the nitrogen in the open cooling system, the pressure to which it is exposed may be reduced, and nitrogen which evaporates as a result may be transported away. In a corresponding open cooling system, however, it is entirely possible for other pressure reducing devices to be used.

As was indicated earlier, the method according to the invention comprises arranging the open cooling system and the closed cooling system at different positions on the load. In this way, the loads to be cooled may be of much greater dimensions than would be possible with an arrangement at just one position because this enables cold losses occurring over a cooling segment to be compensated better. In this case, the primary cooling power may be applied at a first position, at the second position it is then only necessary to compensate for cold losses.

The method according to the invention is used to cool a power supply that has a first end and a second end, wherein the open cooling system is arranged at the first end of the power supply and the closed cooling system is arranged at the second end of the power supply. In this way for example considerably longer line lengths can be created that is possible with methods according to the related art.

As was explained earlier, particularly HTS power supplies can be operated in various load modes. However, the same applies also applies in principle for other loads which may be cooled within the scope of the present invention. In order to service the different cooling needs, it is therefore provided that the method for supplying cooling power is used in a first, smaller amount of total cooling power in a first time period, and in a second, larger amount of total cooling power in a second time period. In this way, the supplied cooling power may be adapted quickly and flexibly to the cooling need.

As was discussed generally before, in this context it is particularly advantageous if a first part of the amount of total cooling power is supplied by the open cooling system and a second part of the amount of total cooling power is supplied by the closed cooling system, wherein the first part is adjusted to a lower value in the first time period than in the second time period. This is therefore also provided according to the invention. In other words, the less energy-efficient open cooling system thus functions advantageously to service requirement peaks, whereas the more energy-efficient closed cooling system caters to the primary need for cooling. To enable such a setting, for example a suitable control or regulating system may be provided which for example evaluates an electrical current strength in a HTSL power supply as an input variable. Therefore, in a method according to the invention the second part is advantageously set in the first time period to the same value as in the second time period.

In particular, the liquid nitrogen which is transported in the circuit in the method suggested according to the invention may be cooled from a temperature level from 70 to 78 K, for example K to a temperature level from 65 to 70 K, for example approximately 67 K in each of the open and closed cooling systems. By cooling the load, the liquid nitrogen carried in the circuit is heated to about 74 K for example. In the open cooling system, a supercooler may be used which contains liquid nitrogen that is brought to a pressure of for example about 0.2 bar by pumping out with the aid of a vacuum pump and so reaches a temperature of for example about 65 K. The cryogenic container filled with liquid nitrogen is advantageously kept at a slight vacuum with the aid of a vacuum pump. The liquid nitrogen transported in the circuit is advantageously cooled at a pressure level from 5 to 20 bar in the open and the closed cooling systems, for which a corresponding (circulation) pump is provided.

The present invention further relates to an apparatus for cooling a load using liquid nitrogen, which apparatus is designed to transport the liquid nitrogen in a circuit, to cool the liquid nitrogen through indirect exchange of heat with cooled liquid nitrogen, and to expose it to an exchange of heat with the load.

The apparatus is characterized in that, in order to cool a first part of the liquid nitrogen, which is provided for cooling the liquid nitrogen transported in the circuit, an open cooling system is provided that is designed to cool the first part of the liquid nitrogen by reducing the pressure and transporting away the nitrogen vapour formed thereby, in order to cool a second part of the liquid nitrogen which is provided for cooling the liquid nitrogen that is transported in the circuit, a closed cooling system is provided comprising one or more cooling units, which particularly include one or more Stirling cooling units and/or one or more Brayton cooling units that operate using neon and/or helium, that the open cooling system and the closed cooling system are designed to cool a power supply that has a first end and a second end, wherein the open cooling system is arranged at the first end of the power supply and the closed cooling system is arranged at the second end of the power supply, and that the apparatus is designed to supply cooling power in a first, smaller amount of total cooling power in a first time period and in a second, larger amount of total cooling power in a second time period, wherein a first part of the amount of total cooling power is supplied by the open cooling system and a second part of the amount of total cooling power is supply by the closed cooling system, and in the first time period the first part is set to a lower value than in the second time period.

Regarding the features and advantages of the apparatus suggested according to the invention, reference is explicitly made to the preceding notes relating to the method according to the invention.

The corresponding explanations also apply for the system which is also suggested according to the invention, comprising a load that is to be cooled and according to the invention includes an apparatus of the kind just explained.

In the following text, the invention will be explained in greater detail with reference to the accompanying drawing, in which embodiments of the invention are illustrated.

Figure 1A:
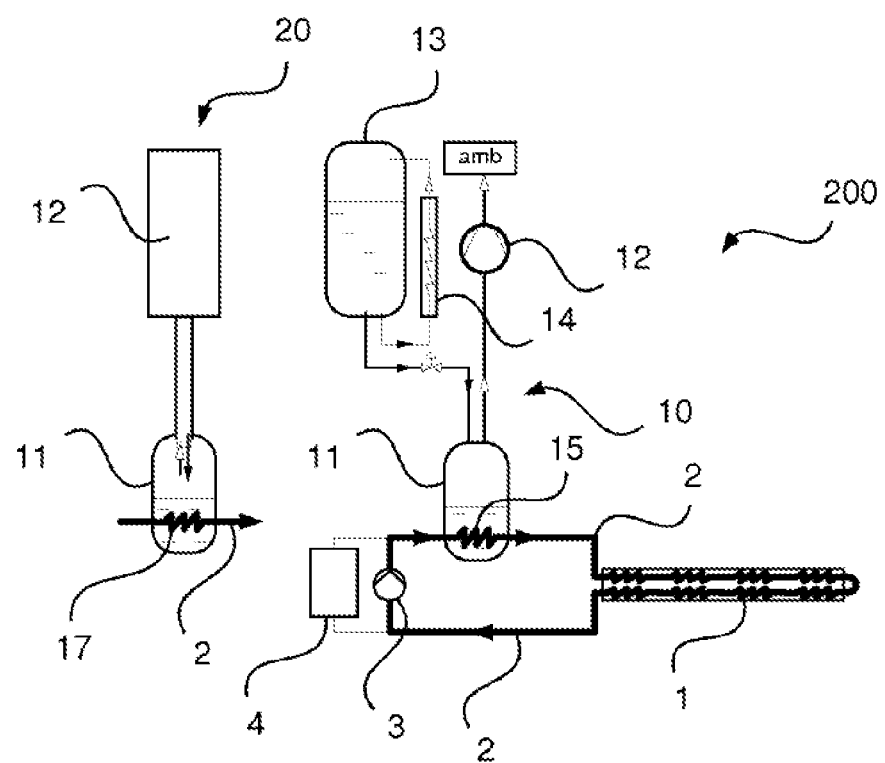
FIG. 1a and FIG. 1b show systems according to the related art in a simplified, schematic representation.

In the figures, identical or functionally equivalent elements are indicate with the same reference signs. For the sake of clarity, an explanation of such elements is not repeated.

DETAILED DESCRIPTION OF THE DRAWING

FIG. 1a shows a simplified, schematic representation of a system according to the related art which is designated as a whole with 200.

The system 200 comprises a load 1, which may in particular be a (HTS) cable system. This is cooled using liquid nitrogen, which is transported in a circulatory flow 2. After cooling of the load 1, the liquid nitrogen in the circulatory flow 2 at a temperature level of for example about 73 K and a pressure level of for example about 10 bar is fed to a liquid nitrogen pump or circulation pump 3, which may be regulated by a pressure regulating system 4.

The temperature of the nitrogen in the circulatory flow 2 is raised thereby to for example about 74 K. The nitrogen in the circulatory flow 2 is then forwarded for supercooling in a supercooler 11 of an open cooling system which is designated as a whole with 10, where it is cooled in a supercooling heat exchanger 15 to a temperature level of for example about 67 K. Downstream from the supercooler 11, the nitrogen in the circulatory flow 2 is at this temperature level and at a pressure level of for example about 15 bar, and is again used to cool the load 1.

The open cooling system 10 comprises a mechanical vacuum pump 12, which extracts nitrogen vapour from the supercooler 11 or from the evaporation chamber thereof and thereby lowers a pressure level in the supercooler 11 or the evaporation chamber thereof to a value of for example about 0.2 bar. A temperature level of the liquid nitrogen present in the supercooler 11 or the evaporation chamber thereof ("bath nitrogen") is lowered thereby to a value of for example about 65 K.

In order to compensate for corresponding evaporation losses, a liquid nitrogen reservoir 13 is provided, which may be filled using an air separation plant for example and/or by external refilling. In the example shown, the liquid nitrogen reservoir 13 includes a device for pressure build-up vaporisation 14.

As was mentioned earlier, the operation of a corresponding open cooling system 10 is somewhat unfavourable from an energy point of view, since the nitrogen drawn off with the vacuum pump 12 is typically discharged to the atmosphere (amb) here.

Alternatively, but not in addition to a corresponding open cooling system 10, the related art may therefore also make use of a closed cooling system 20 having a supercooler 11 and a supercooling heat exchanger 17, as is shown partially here.

In system, the nitrogen is cooled in the supercooler 11, which may be of generally comparable design to the supercooler 11 of an open cooling system, using a suitable cooling unit which, as explained, may particularly comprise one or more Stirling coolers and/or one or more Brayton coolers that are powered using neon and/or helium.

Figure 1B:
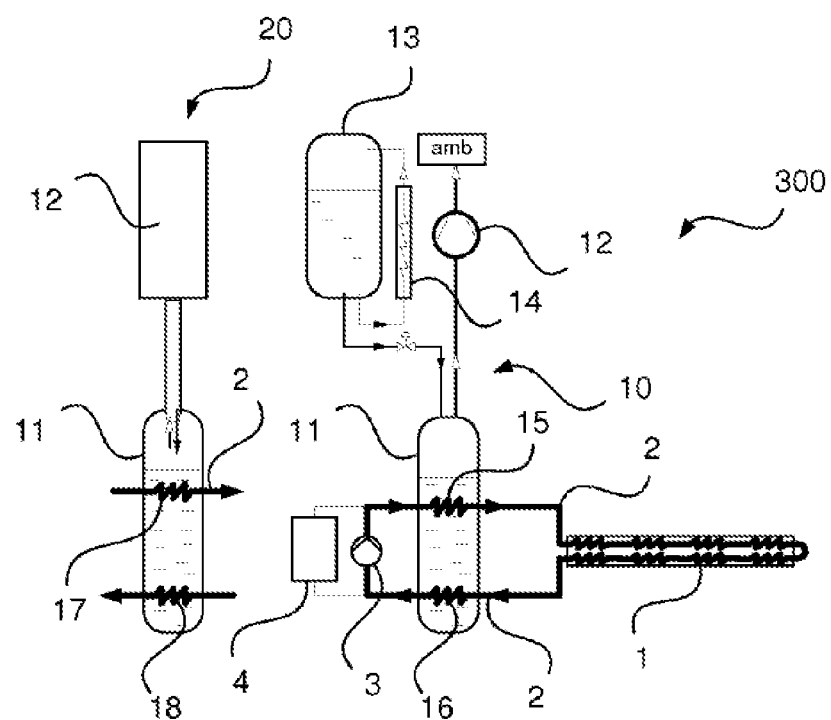

FIG. 1b shows a simplified, schematic representation of a system according to the related art which is designated as a whole with 300. The system 300 is constructed similarly to the system 200 of FIG. 1a, but is equipped with an additional supercooling heat exchanger 16 in the open cooling system 10 (or an additional supercooling heat exchanger 18 in the closed cooling system 20) upstream of the pump 3.

Figure 2:
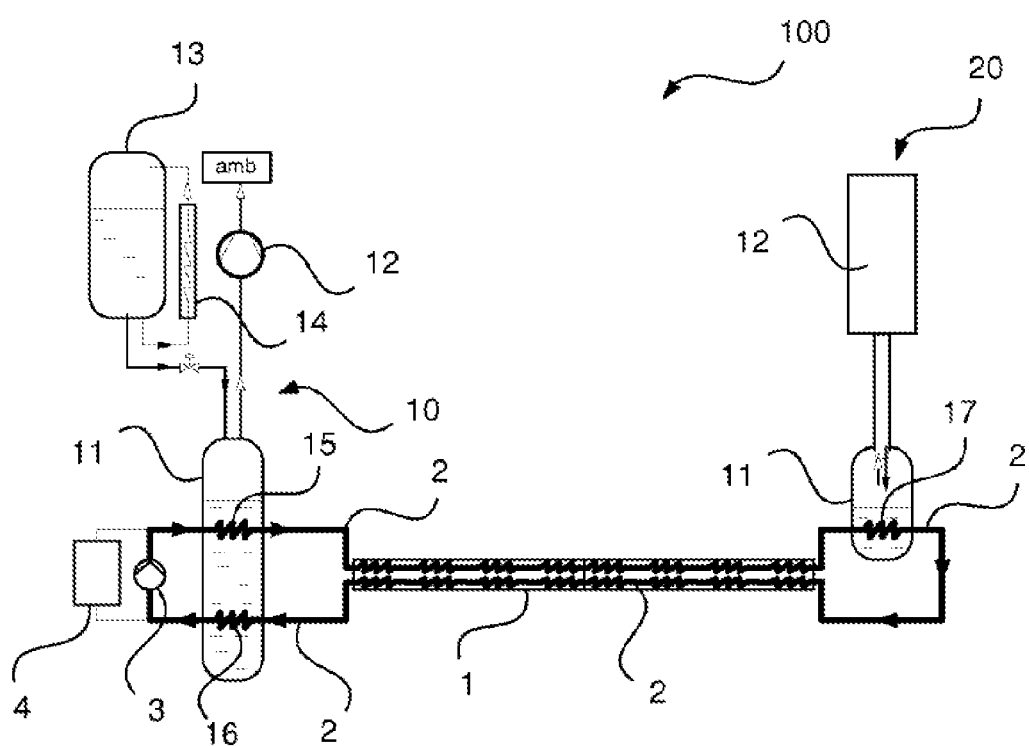
FIG. 2 shows a system according to an embodiment of the invention in a simplified, schematic representation.

FIG. 2 shows a simplified, schematic representation of a system according to an embodiment of the invention which is designated as a whole with 100.

The system 100 essentially comprises the components explained with reference to FIGS. 1a and 1b and the systems 200 and 300 illustrated therein. However, both the open cooling system 10 and the closed cooling system 20 are provided in the system 100.

In the system 100, after supercooling in the supercooler 11 of the open cooling system 10 or the supercooling heat exchanger 15 thereof, the liquid nitrogen of the circulatory flow 2 is used to cool the load 1, but after that it is not returned to the pump 3 but instead it is first cooled again in the supercooler 11 of the closed cooling system 20.

The temperature and pressure levels at the entry to and exit from the supercooler 11 of the open cooling system 10 discussed previously with reference to the system 200 of FIG. 1 are also present in system 100. After it is used to cool the load 2 and before entering the supercooler 11 of the closed cooling system as far as 20, the liquid nitrogen of the circulatory flow 2 has a temperature level for example about 73 K.

In the supercooler 11 of the closed cooling system 20, the liquid nitrogen of the circulatory flow 2 is cooled to a temperature level of for example about 67 K, and at this temperature level it is used again to cool the load 1. The nitrogen of the circulatory flow 2 is returned to pump 3 at a pressure level of for example about 10 bar and a temperature level of for example about 73 K and prior to that is again cooled in the supercooler 11 of the open cooling system 10 or the supercooling heat exchanger 11 thereof.

The invention claimed is:

1. A method for cooling a load using liquid nitrogen which is transported in a circuit, cooled by indirect exchange of heat with cooled liquid nitrogen and exposed to an exchange of heat with the load, said method comprising: cooling a first part of the liquid nitrogen used to cool the liquid nitrogen transported in the circuit by indirect heat exchange in an open cooling system (10) by pressure reduction and removal of nitrogen vapor formed, and cooling a second part of the liquid nitrogen used to cool the liquid nitrogen transported in the circuit by indirect heat exchange in a closed cooling system (20) using one or more cooling units, the open cooling system (10) and the closed cooling system (20) are used to cool a power supply (1) having a first end and a second end, wherein the open cooling system (10) is arranged on the first end of the power supply (1) and the closed cooling system (20) is arranged on the second end of the power supply (1), and cooling power is supplied in a first period and a second period, wherein in the first, period a smaller amount of a total cooling power is supplied and in the second period a higher amount of the total cooling power is supplied, wherein a first part of the total cooling power is supplied by the open cooling system (10) and a second part of the total cooling power is supplied by the closed cooling system (20), and the first part of the total cooling power is set to a lower value in the first period than in the second period.

2. The method according to claim 1, in which the second part of the total cooling power is set to the same value in the first time period as in the second time period.

3. The method according to claim 1, in which the liquid nitrogen transported in the circuit is cooled in the open cooling system (10) and in the closed cooling system (20) from a first temperature level within a range of from 70 to 78 K to a second temperature level within a range of from 65 to 70 K in each case, wherein said first temperature level and said second temperature level are different.

4. The method according to claim 1, in which the liquid nitrogen transported in the circuit is cooled at a pressure level from 5 to 20 bar in the open cooling system (10) and the closed cooling system (20).

5. The method according to claim 1, in which the cooling unit or cooling units used comprise a Stirling or Brayton cooling unit that uses neon and/or helium.

6. An apparatus for cooling a load using liquid nitrogen, which is configured to transport the liquid nitrogen in a circuit, to cool the transported liquid nitrogen by indirect exchange of heat with cooled liquid nitrogen, and to expose the transported liquid nitrogen to an exchange of heat with the load, said apparatus comprising: an open cooling system (10) designed to cool a first part of the liquid nitrogen by reducing pressure and transporting away nitrogen vapor which forms for cooling the first part of the liquid nitrogen, which part is provided for cooling the liquid nitrogen transported in the circuit, a closed cooling system (20) comprising one or more cooling units for cooling a second part of the liquid nitrogen for cooling the liquid nitrogen that is transported in the circuit, wherein the open cooling system (10) and the closed cooling system (20) are designed to cool a power supply (1) that has a first end and a second end, wherein the open cooling system (10) is arranged on the first end of the power supply (1) and the closed cooling system (20) is arranged on the second end of the power supply (1), and the apparatus is designed to provide cooling power in a first period and a second period, wherein in the first period a smaller amount of a total cooling power is supplied and in the second period a higher amount of the total cooling power is supplied, wherein a first part of the total cooling power is supplied by the open cooling system (10), and a second part of the total cooling power is supplied by the closed cooling system (20), and the first part of the amount of total cooling power can be adjusted to a lower value in the first period than in the second period.

7. The apparatus according to claim 6, in which the cooling unit or cooling units used comprise a Stirling or Brayton cooling that uses neon and/or helium.

8. A system (100) with a power supply (1) to be cooled, comprising an apparatus according to claim 6 used to cool the power supply.

9. The system according to claim 8, in which the cooling unit or cooling units used comprise a Stirling or Brayton cooling that uses neon and/or helium.

10. The method according to claim 1, in which the cooling power of the closed cooling system (10) is 25 to 75% of the total cooling power.

* * * * *